US007687337B2

(12) United States Patent
Zhang et al.

(10) Patent No.: US 7,687,337 B2
(45) Date of Patent: Mar. 30, 2010

(54) TRANSISTOR WITH DIFFERENTLY DOPED STRAINED CURRENT ELECTRODE REGION

(75) Inventors: Da Zhang, Fishkill, NY (US); Mark C. Foisy, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 201 days.

(21) Appl. No.: 11/779,318

(22) Filed: Jul. 18, 2007

(65) Prior Publication Data

US 2009/0020783 A1 Jan. 22, 2009

(51) Int. Cl.
*H01L 21/336* (2006.01)
(52) U.S. Cl. .................. 438/197; 438/222; 438/226; 438/230; 438/285; 257/E21.64; 257/E21.615
(58) Field of Classification Search ................ 257/288, 257/E21.615, E21.64; 438/197, 222, 226, 438/230, 285
See application file for complete search history.

(56) References Cited

U.S. PATENT DOCUMENTS

| 5,903,029 | A | | 5/1999 | Hayashida et al. | |
|---|---|---|---|---|---|
| 6,071,783 | A | * | 6/2000 | Liang et al. | 438/301 |
| 6,605,498 | B1 | * | 8/2003 | Murthy et al. | 438/197 |
| 6,621,131 | B2 | * | 9/2003 | Murthy et al. | 257/408 |
| 2006/0009001 | A1 | * | 1/2006 | Huang et al. | 438/305 |
| 2006/0046406 | A1 | * | 3/2006 | Chindalore et al. | 438/301 |
| 2006/0138398 | A1 | * | 6/2006 | Shimamune et al. | 257/19 |
| 2006/0270133 | A1 | * | 11/2006 | Yasutake | 438/197 |

FOREIGN PATENT DOCUMENTS

| EP | 0481559 A2 | 4/1992 |
|---|---|---|
| JP | 04-260335 | 9/1992 |
| JP | 07-074349 | 3/1995 |
| JP | 10-050988 | 2/1998 |

OTHER PUBLICATIONS

International Search Report and Written Opinion correlating to PCT/US2008/06669, dated Oct. 29, 2008.

(Continued)

*Primary Examiner*—Thanh V Pham
*Assistant Examiner*—Duy T Nguyen
(74) *Attorney, Agent, or Firm*—David G. Dolezal; Robert L. King

(57) ABSTRACT

A transistor is formed by providing a semiconductor layer and forming a control electrode overlying the semiconductor layer. A portion of the semiconductor layer is removed lateral to the control electrode to form a first recess and a second recess on opposing sides of the control electrode. A first stressor is formed within the first recess and has a first doping profile. A second stressor is formed within the second recess and has the first doping profile. A third stressor is formed overlying the first stressor. The third stressor has a second doping profile that has a higher electrode current doping concentration than the first profile. A fourth stressor overlying the second stressor is formed and has the second doping profile. A first current electrode and a second current electrode of the transistor include at least a portion of the third stressor and the fourth stressor, respectively.

23 Claims, 6 Drawing Sheets

OTHER PUBLICATIONS

M. Horstmann, A. Wei, T. Kammler, J. Hontschel, H. Bierstedt, T. Feudel, K. Frohberg, M. Gerhardt, A. Hellmich, K. Hempel, J. Hohage, P. Javorka, J. Klais, G. Koerner, M. Lenski, A. Neu, R. Otterbach, P. Press, C. Reichel, M. Trentsch, B. Trui, H. Salz, M. Schaller, H.-J. Engelmann, O. Herzog, H. Ruelke, P. Hubler, R. Stephan, D. Greenlaw, M. Raab, and N. Kepler, Integration and Optimization of Embedded-SiGe, Compressive and Tensile Stressed Liner Films, and Stress Memorization in, IEEE 2005.

Shyam Gannavaram, Nemanja Pesovic & Mehmet C. Ozturk, Low Temperature (<800C) Recessed Junction Selective Silicon-Germanium Source/Drain Technology for sub-70 nm CMOS, IEEE 2000.

\* cited by examiner

TRANSISTOR WITH DIFFERENTLY DOPED STRAINED CURRENT ELECTRODE REGION

BACKGROUND OF THE INVENTION

1. Field of the Invention

This invention relates in general to semiconductor devices and more specifically to current electrode region formation.

2. Description of the Related Art

The drive current of a transistor such as a field effect transistor (FET) transistor may be improved by creating a strain in the channel region. This strain may increase the carrier mobility of the transistor. With some N-channel transistors, a tensile strain in the channel direction may provide for increased electron mobility in the channel. With some P-channel transistors, a compressive strain in the channel direction may provide for increased hole mobility.

What is desired is an improved technique for forming current electrode regions with stressor materials for generating strain in a channel region.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Current electrode regions with stressor structures can be formed by epitaxially growing a layer of stressor material that is not doped (or with relatively little doping) with current electrode dopants followed by epitaxially growing a layer of stressor material that is in-situ doped with current electrode dopants. In one example, such layers may be used in the formation of current electrode extension regions.

Figure 1:
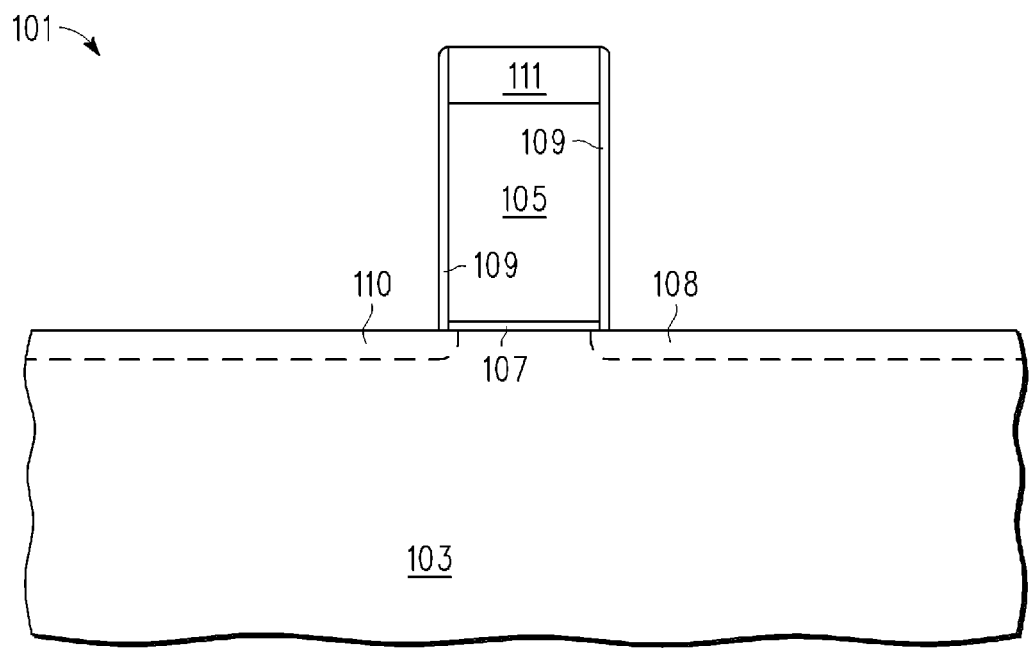
FIGS. 1-9 show side cut away views of various stages in the manufacture of a semiconductor device according to one embodiment of the present invention.

FIG. 1 is a side cut away view of a wafer 101. Wafer 101 includes a semiconductor layer 103, which in the embodiment shown is a bulk semiconductor substrate layer. In one embodiment, layer 103 is made of monocrystalline silicon but may be made of other semiconductor materials (e.g. silicon germanium) (including one or more layers of different materials) in other embodiments. Also in other embodiments, wafer 101 may have a semiconductor on insulator (SOI) configuration where layer 103 is located over an insulator layer (not shown). Also, layer 103 may have channel well doping (e.g. boron, indium, phosphorous, arsenic, or antimony).

A gate dielectric layer 107, a gate electrode 105, and a gate cap 111 are formed over layer 103. Gate dielectric layer 107 may be grown from the oxidation of layer 103 or may be a deposited layer such as a metal oxide layer (e.g. a high K dielectric layer). Gate electrode 105 may be made of one or more layers of a gate material (e.g. polysilicon, metal, or combinations thereof). Cap 111 is utilized for protecting gate electrode 105 during subsequent processes and may be formed from any suitable material (e.g. nitride). In one embodiment, gate electrode 105 has a thickness in the range of 500-1000 angstroms, but may be of other thicknesses in other embodiments. In one embodiment, dielectric layer 107 has a thickness of 10-50 Angstroms but may have other thicknesses in other embodiments.

Layer 107, gate electrode 105, and cap 111 are formed from layers of material that are located over all of layer 103 and then subsequently patterned to form the structure shown in FIG. 1.

After the patterning to form gate electrode 105 and cap 111, a relatively thin spacer 109 is formed. In one embodiment, spacer 109 is formed from a layer of spacer material that is deposited over wafer 101 and then anisotropically etched. In one embodiment, the deposited layer has a thickness in the range of 40-100 angstroms, but may have other thicknesses in other embodiments. In one embodiment, spacer 109 is made of silicon nitride, but in other embodiments, but may be made of other dielectric materials.

In the embodiment shown, a low energy or shallow implantation of current electrode dopants may be implanted into layer 103 to form regions 108 and 110 after the formation of spacer 109. After implantation, these dopants may be annealed such that they move laterally in layer 103 under the edges of gate electrode 105.

Figure 2:
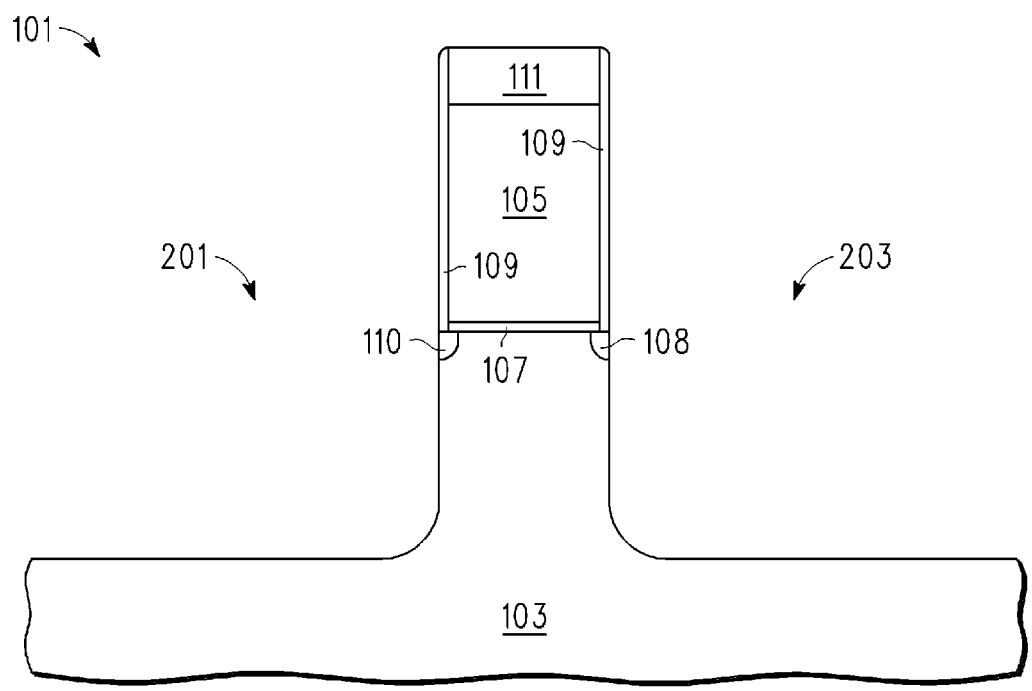

FIG. 2 shows a cut away side view of wafer 101 after recesses 201 and 203 are formed in layer 103 lateral to gate electrode 105. In one embodiment, recesses 201 and 203 are formed by anisotropically etching layer 103, e.g. for a predetermined period of time. In one embodiment, recesses 201 and 203 are formed with a dry etch chemistry including HBr and $Cl_2$, but may be etched by other techniques or with other etch chemistries in other embodiments. In one embodiment, recesses are 1000 angstroms deep, but may have other depths in other embodiments.

Figure 3:
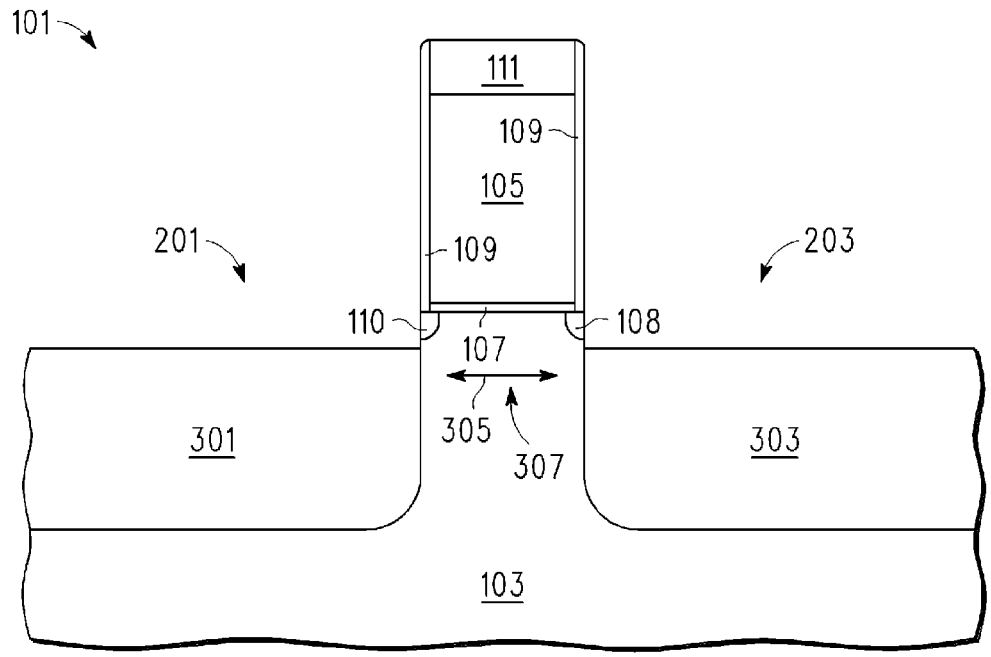

FIG. 3 shows a cut away side view of wafer 101 after semiconductor stressors 301 and 303 are epitaxially grown on exposed portions of layer 103 in recesses 201 and 203, respectively. A "stressor" is a structure having a crystal lattice constant in at least a first direction that is different from the natural lattice constant for that material.

In one embodiment, stressors 301 and 303 are grown by an epitaxial process (e.g. chemical vapor deposition) where the atomic spacing of the lattice in the planar direction (the horizontal direction in the view of FIG. 3) of stressors 301 and 303 matches that of layer 103. In one embodiment, stressors 301 and 303 are grown to a thickness (e.g. 900 angstroms) that is less than the depth of recesses 201 and 203.

Stressors 301 and 303 are structures that include atoms that provide stressors 301 and 303 with a natural lattice constant (a relaxed state lattice constant) that is different than the lattice constant of layer 103. When stressors 301 and 303 are epitaxially grown from layer 103, the atomic spacings of these stressors are aligned with the spacings of layer 103 to create a strain in stressors 301 and 303 in the planar direction.

In one embodiment, stressors 301 and 303 are made of silicon germanium. In one embodiment, the atomic percent of germanium is the range of 15-40% atomic percent but may be at other percentages in other embodiments. In an embodiment where layer 103 is made of silicon, the germanium in stressors 301 and 303 causes those stressors to be compressively strained in the planar direction in that their natural lattice constant is greater than the actual atomic spacings of those stressors in at least one direction. This compressive strain in stressors 301 and 303 acts to generate a compressive strain in channel region 307 in the direction of hole movement (e.g. current direction 305). This compressive strain in channel region 307 may act to improve drive current in a P-channel transistor.

In other embodiments, other types of atoms (e.g. tin, lead) may be included in stressors 301 and 303 to provide the stressor with a greater natural lattice constant than the lattice constant of layer 103. In other embodiments, stressors 301 and 303 may be formed from the same elements as layer 103, where the concentration of an element is greater or less than its concentration in layer 103. For example, if layer 103 is made of silicon germanium with a first concentration of germanium, stressors 301 and 303 may be made of silicon germanium with a higher concentration of germanium to increase the natural lattice constant over the lattice constant of layer 103.

In other embodiments, channel region 307 may be a channel region for an N-channel transistor. In such embodiments, it may be desirable to create a tensile strain in channel region 307 in the current direction 305. Such a tensile strain may be created by forming stressors 301 and 303 that are tensilely strained such that they act to "pull apart" channel region 307 to provide the tensile strain in channel region 307.

In one embodiment, stressors 301 and 303 are formed to have a tensile strain by forming them with a material that has a natural lattice constant that is smaller than the lattice constant of layer 103. In embodiments where layer 103 is formed from monocrystalline silicon, stressors 301 and 303 may be formed from silicon carbon. In one embodiment, the atomic percent of carbon in stressors 301 and 303 would be in the range of %0.5-2.5, but may be of other percentages in other embodiments.

Stressors 301 and 303 may be made of other materials in other embodiments. For example, where layer 103 is made of silicon germanium, then stressors 301 and 303 may be made of silicon. In such a situation, the natural lattice constant of silicon would be smaller than that of silicon germanium.

Figure 4:
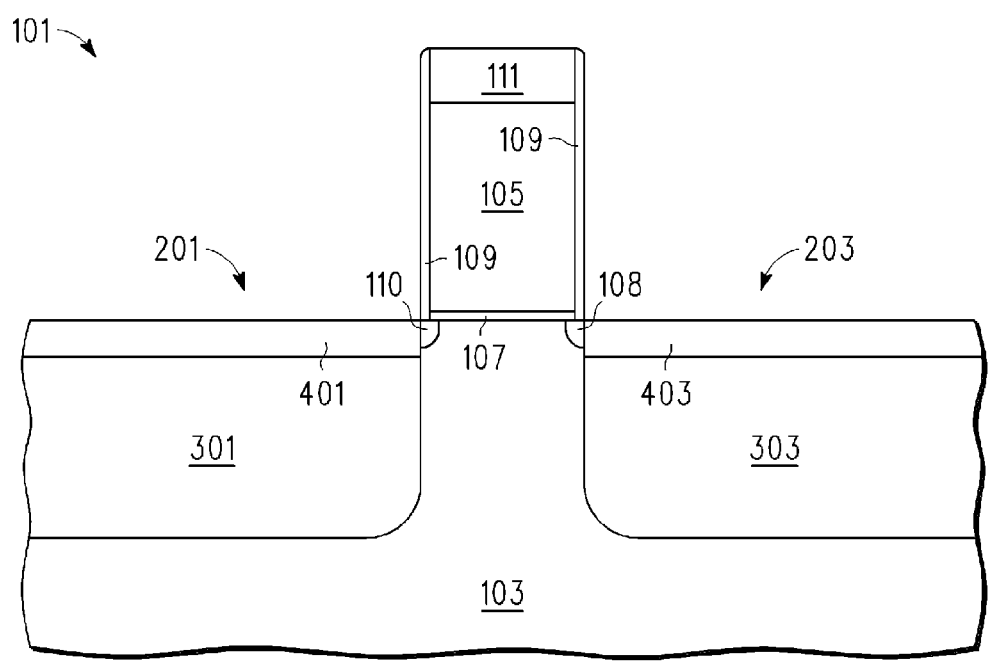

FIG. 4 shows a cutaway side view of wafer 101 after the formation of stressor 401 on stressor 301 and the formation of stressor 403 on stressor 303. In one embodiment, stressors 401 and 403 are formed by epitaxially growing the stressors from stressors 301 and 303, respectively, such that these layers have the same atomic spacings as stressors 301 and 303. In one embodiment, stressors 401 and 403 have a thickness in the range of 50-200 angstroms, but may have other thicknesses in other embodiments.

Stressors 401 and 403 are of a material that has a different natural lattice constant than the lattice constant stressors 301 and 303. Accordingly, Stressors 401 and 403 are under either a compressive strain or a tensile strain, depending upon their desired effect on channel region 307. In embodiments where layer 103 is made of silicon, stressors 401 and 403 may include silicon germanium if a compressive strain is desired in channel region 307. In other embodiments, stressors 401 and 403 may include silicon carbon where layer 103 is made of silicon and a tensile strain is desired in channel region 307.

In one embodiment, stressors 401 and 403 are of the same material as stressors 301 and 303 except that they include a doping profile having a relatively higher concentration of in-situ current electrode dopants of the conductivity type for the desired type of transistor (P-channel or N-channel). Where a P-channel transistor is to be formed, stressors 401 and 403 would include boron. Where an N-channel transistor is to be formed, stressors 401 and 403 would include phosphorous, arsenic, and/or antimony.

In one embodiment, stressors 401 and 403 are formed by flowing a current electrode dopant precursor in a deposition chamber where the epitaxial growth process is performed. In one embodiment, stressors 301 and 303 may be formed in the same chamber where stressors 401 and 403 are formed. In one embodiment, during the formation of stressors 301 and 303, stressors 401 and 403 are formed by introducing the current electrode doping precursor into the chamber.

An example of a boron dopant precursor is $B_2H_6$. An example of a phosphorous dopant precursor is $PH_3$. An example of a arsenic dopant precursor is $AsH_3$.

In one example, an in-situ doped stressor 401 and 403 of silicon germanium and boron are formed by a chemical vapor deposition (CVD) process where $B_2H_6$, $SiH_4$, and $GeH_4$ gases are flowed at a pressure in the range of approximately 40 Torr. In one example, an in-situ doped stressors 401 and 403 of silicon germanium and phosphorous are formed by a chemical vapor deposition (CVD) process where $PH_3$, $SiH_4$, and $GeH_4$ gases are flowed at a pressure of approximately 40 Torr. Stressors 401 and 403 may be formed by other techniques and with other materials in other embodiments.

In some embodiments where the dopant is boron, the in-situ doping concentration of boron in stressors 401 and 403 is in the range of $1-5 \times 10^{20}$ (1-5e20) atoms/cm$^3$. In some embodiments where the dopant is antimony, the in-situ doping concentration of antimony in stressors 401 and 403 is in the range of 5e19-2e20 atoms/cm$^3$. In some embodiments where the dopant is phosphorous, the doping concentration of phosphorous in stressors 401 and 403 is in the range of 1-5e20 atoms/cm$^3$. In some embodiments where the dopant is arsenic, the doping concentration of arsenic in stressors 401 and 403 is in the range of 1-5e20 atoms/cm$^3$. However, stressors of other embodiments may have other doping concentration levels.

In the embodiment shown, the current electrode doping concentration of stressors 301 and 303 is between zero and $1 \times 10^{16}$ atoms per cm$^3$. However in other embodiments, stressors 301 and 303 may have a higher concentration of current electrode dopants, which is lower than the current electrode doping concentration of stressors 401 and 403. In some embodiments, stressors 301 an 303 may be doped with a dopant that is of an opposite conductivity type to the dopant of stressors 401 and 403. For example, if stressors 401 and 403 are doped with boron, stressor 301 and 303 may be doped with phosphorous, arsenic, and/or antimony.

Figure 5:
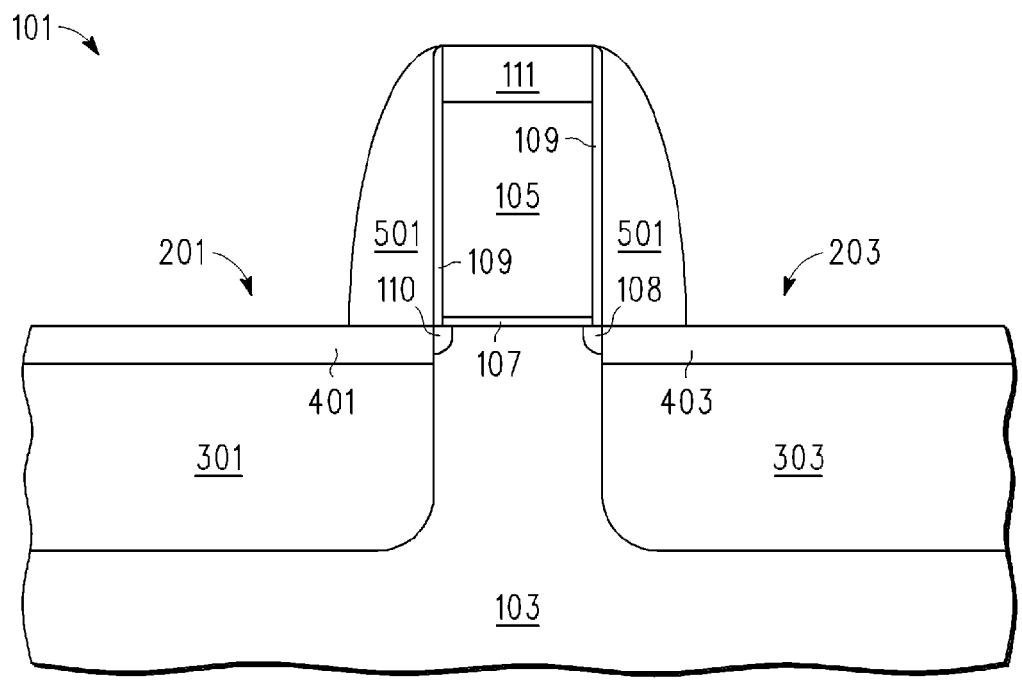

FIG. 5 shows a cutaway side view of wafer 101 after sidewall spacer 501 is formed over layer 103 and over portions of stressors 401 and 403. In one embodiment, spacer 501 is formed by depositing a layer of spacer material (e.g. silicon nitride) over wafer 101 and subsequently anisotropically etching the layer. In one embodiment, the layer of spacer material has a bottom width in the range of 200-600 angstroms, but may have other dimensions in other embodiments.

Figure 6:
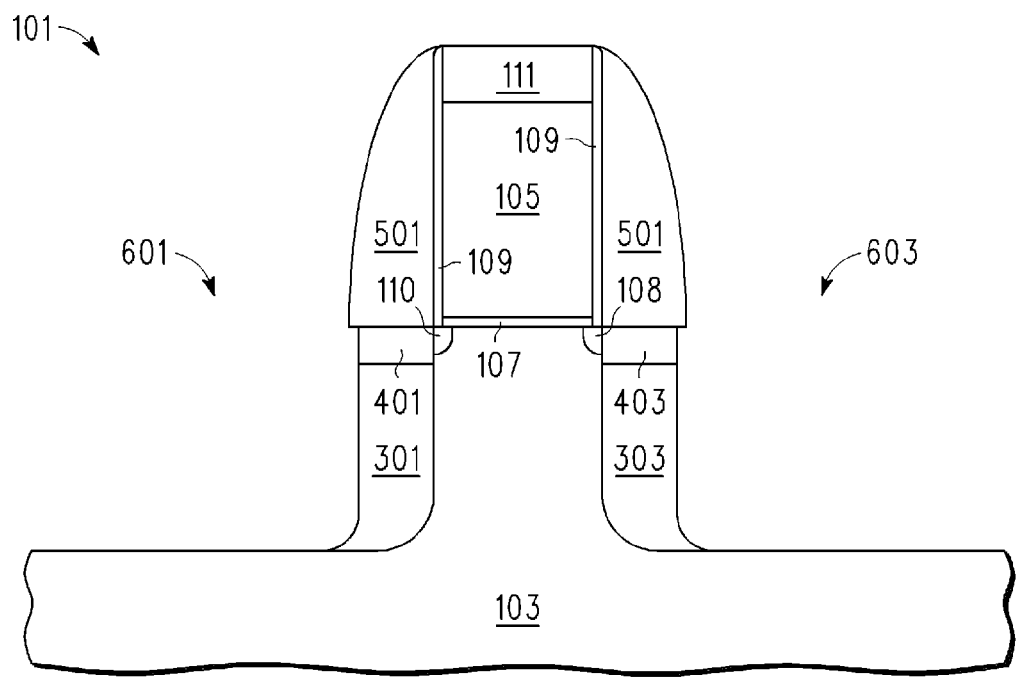

FIG. 6 shows a cutaway side view of wafer 101 after recesses 601 and 603 are formed in wafer 101 lateral to gate electrode 105 and spacer 501. In the embodiment shown, recesses 601 and 603 extend down to remove the portions of stressors 301 and 401 and stressors 303 and 403, respectively, in those areas. However, in other embodiments, the bottom of the recesses may extend deeper into layer 103 or it may not extend as deep as the bottom of stressors 301 and 303. In one embodiment, recesses 601 and 603 are formed by an isotropic dry etch with an etch chemistry that includes $SF_6$. With an isotropic etch, some of stressors 401, 403, 301, and 303 under spacer 501 are removed. In other embodiments, recesses 601 and 603 may be formed by other types of etch processes.

Figure 7:
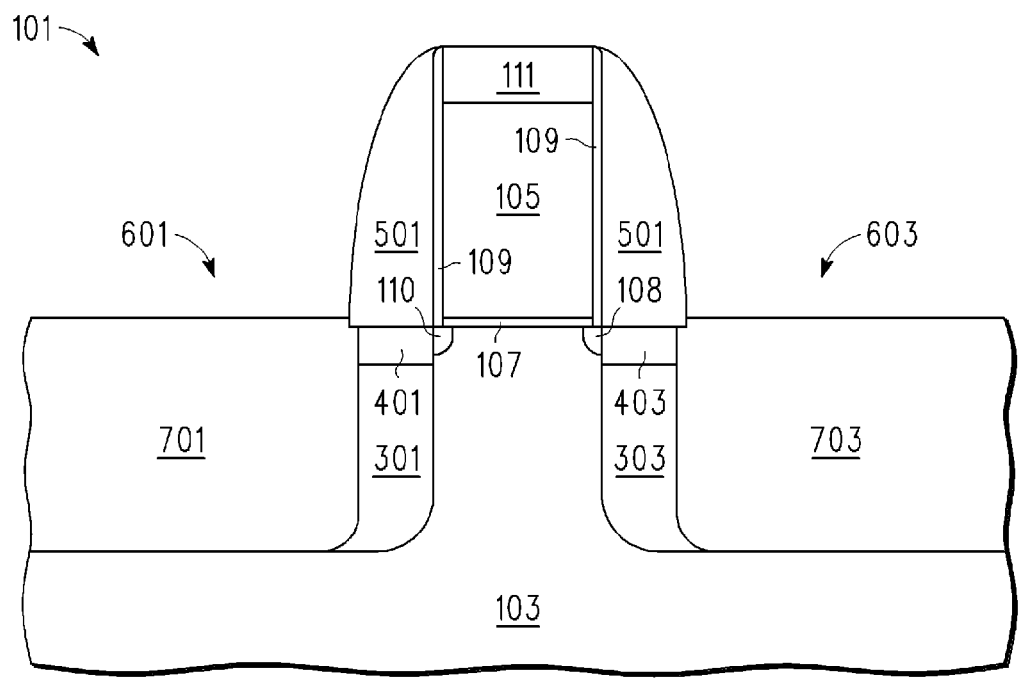

Referring to FIG. 7, electrode structures 701 and 703 are formed in recesses 601 and 603. In one embodiment, structures 701 and 703 are formed by epitaxially growing the material in the recesses. In some embodiments where structures 701 and 703 are epitaxially grown, these structures may be characterized as stressors where they include material that would have a different natural lattice constant than layer 103. With such embodiments, structures 701 and 703 aid in providing a strain in channel region 307.

In embodiments where a compressive strain in channel region 307 is desired, structures 701 and 703 would be of a material with a larger natural lattice constant than layer 103. An example of such an embodiment is where layer 103 is made of silicon and structures 701 and 703 include silicon germanium.

In embodiments, where a tensile strain in channel region 307 is desired, structures 701 and 703 would be a material with a smaller natural lattice constant than layer 103. An example of such an embodiment is where layer 103 is made of silicon and structures 701 and 703 include silicon carbon. Another example is where layer 103 is made of silicon germanium and structures 701 and 703 include silicon.

In one example, structures 701 and 703 have the same atomic percent of germanium or carbon as stressors 401, 403, 301, and 303. However in other embodiments, structures 701 and 703 may have a different atomic percent.

In one embodiment, structures 701 and 703 are in-situ doped with a current electrode dopant (arsenic, phosphorous, or boron). In embodiments where the dopant is boron, the doping profile of boron is in the range of 1-5e20 atoms/cm$^3$. In embodiments where the dopant is phosphorous, the doping profile of phosphorous is in the range of 1-5e20 atoms/cm$^3$. In embodiments where the dopant is arsenic, the doping profile of arsenic is in the range of 1-5e20 atoms/cm$^3$. Structures 701 and 703 may have other doping profiles in other embodiments.

In other embodiments, structures 701 and 703 may be formed without an in-situ current electrode dopant and then subsequently doped e.g. by ion implantation.

Figure 8:
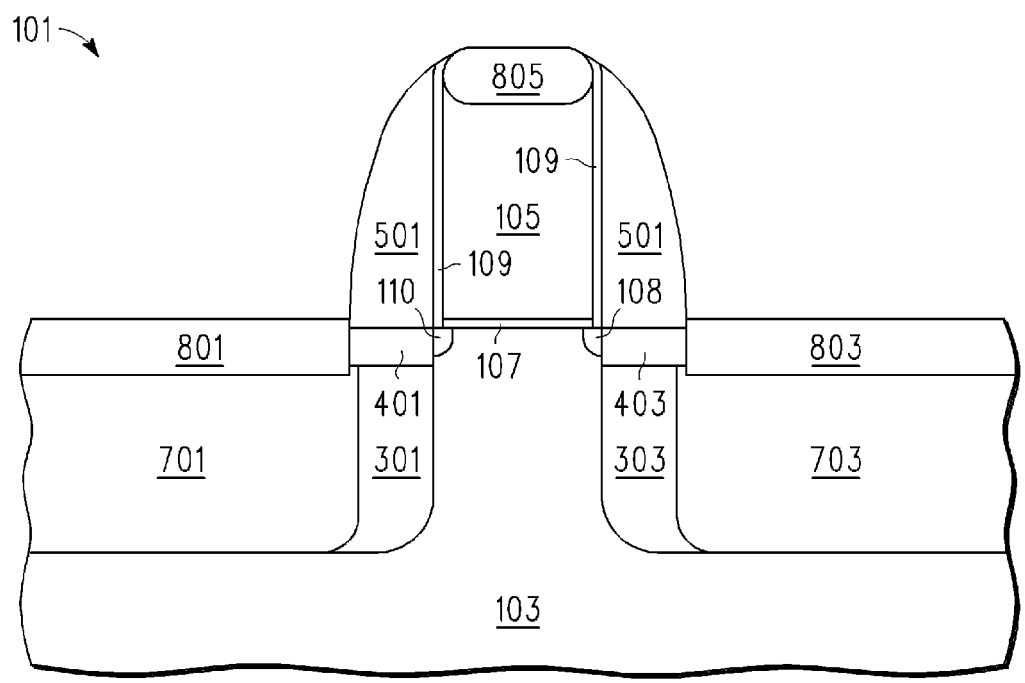

FIG. 8 is a side view of wafer 101 after silicide regions 801, 803, and 805 are formed on wafer 101. In one embodiment, prior to forming suicide region 805, cap 111 is removed (e.g. with a selective dry etch process). This etch may also remove some of spacer 501. In one embodiment, silicide regions 801, 803, and 805 are formed by depositing a layer of metal (e.g. Nickel) on wafer 101, reacting the metal with exposed semiconductor material, and then removing the unreacted metal.

Figure 9:
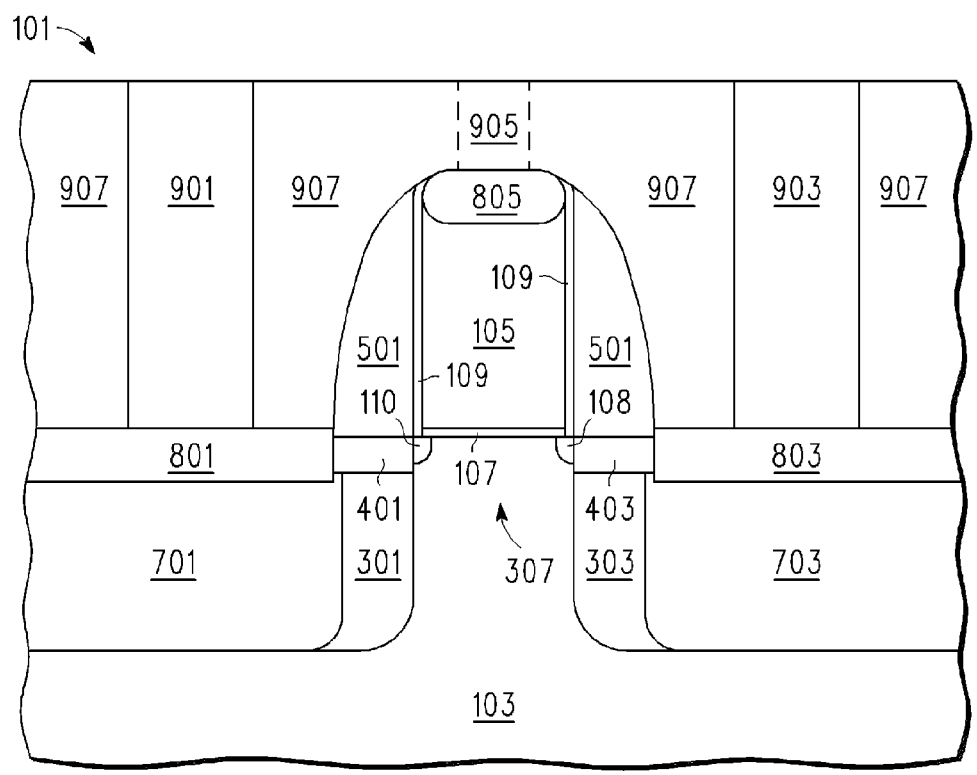

FIG. 9 shows a side view of wafer 101 after the formation of dielectric layer 907 over wafer 101. Layer 907 may include multiple stacks of materials, e.g. SiN and SiO$_2$. Contacts 901, 903, and 905 (e.g. tungsten) are formed to electrically contact the silicide regions 801, 803, and 805 respectively. In one embodiment, contacts 901, 903, and 905 include barrier layers (not shown).

Other processes may be performed on wafer 101 subsequent to the stage in FIG. 9. For example, electrical interconnects and interlevel dielectrics may be formed over layer 907. External electrical connectors (e.g. bond pads) and passivation layers may be formed over the interconnect layers. Wafer 101 may be singulated (e.g. with a wafer saw) into individual integrated circuits (semiconductor die). Each integrated circuit may include a large number of transistors similar to that shown in FIG. 9 with some being N-channel transistors and others being P-channel transistors.

In other embodiments, other processes may be performed on wafer 101. For example, anneal processes may be performed.

In the embodiment shown, the portion of stressors 401 and 403 remaining in FIG. 9 serve as current electrode extension regions for the transistor of FIG. 9. In the embodiment shown, the formation of current electrode extension regions with stressors 401 and 403 may allow for stressor material to be located close to channel region 307 for imparting strain in channel region 307 to improve carrier mobility. Furthermore, forming the current electrode extension regions with a material that is in-situ doped with current electrode dopants may provide for increased strain in channel region 307 in that the current electrode extensions are formed with in-situ dopants in the stressor material, and not by ion implantation. In some examples, implanting dopants into a stressor material followed by a subsequent anneal of those dopants may reduce the strain in the stressor such that it imparts less of a strain in a channel region.

Furthermore, in the embodiment of FIGS. 1-9, having a virtually undoped stressors (e.g. 301 and 303) (or a stressor having a lower doping concentration) formed below the in-situ doped stressors 401 and 403, may advantageously allow for stressor structures to be located closer to the channel regions at deeper areas below gate electrode 105, while still maintaining relatively shallow current electrode extension regions (stressors 401 and 403 in FIG. 9) of a higher current electrode doping concentration of the desired conductivity type. Because undoped (or low concentration doping) stressor 301 and 303 are used beneath the current electrode extension regions (stressors 401 and 403 in FIG. 9), shallow current electrode extension profiles may be maintained for short channel effect control while imparting stress on channel region 307.

Figure 10:
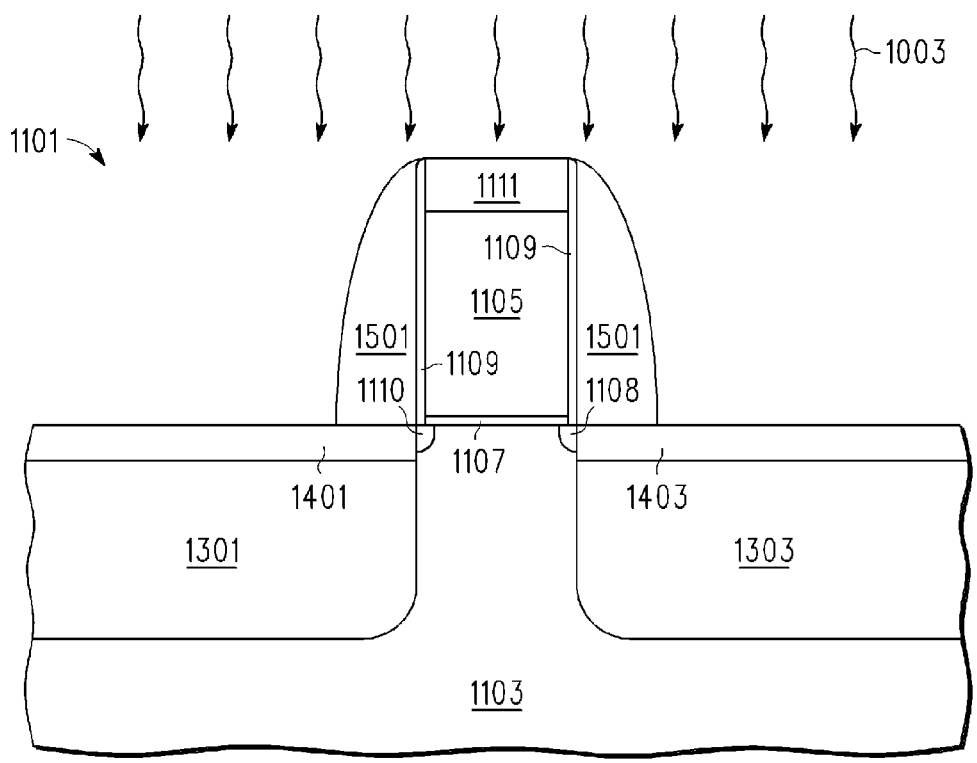
FIGS. 10-11 show side cut away views of various stages in the manufacture of a semiconductor device according to another embodiment of the present invention.
Figure 11:
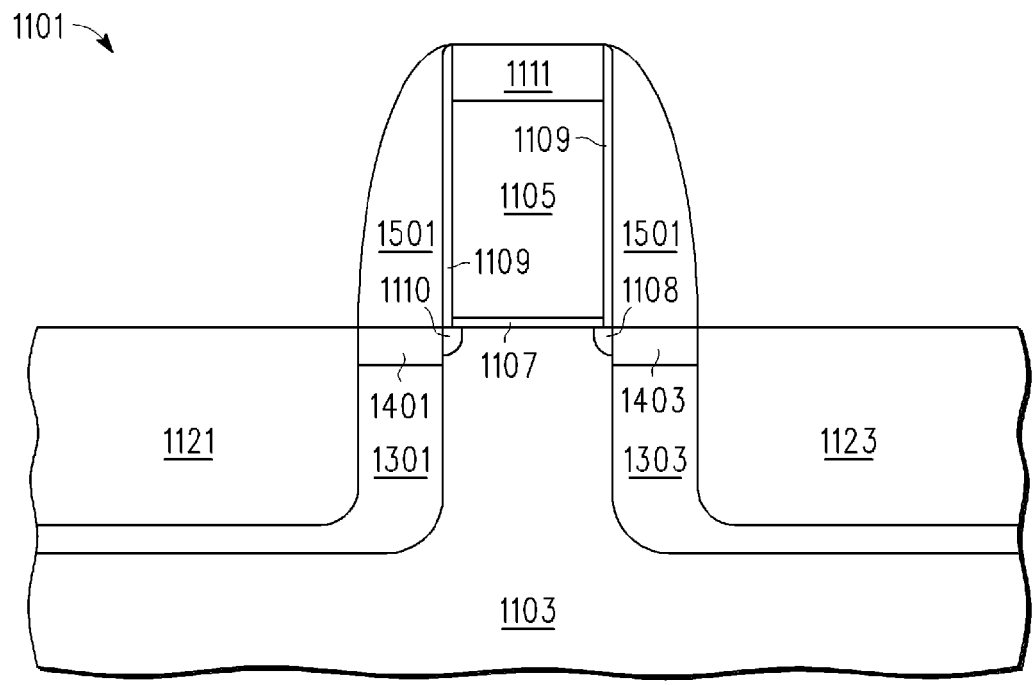

FIGS. 10 and 11 show partial cutaway side views of a wafer 1101 during various stages in its manufacture according to another embodiment. Wafer 1101 is similar to wafer 101 where cap 1111, gate electrode 1105, spacer 1109, dielectric layer 1107, spacer 1501, regions 1108 and 1110, stressors 1301, 1303, 1401, and 1403, and layer 1103 are similar to cap 111, gate electrode 105, spacer 109, regions 108 and 110, dielectric layer 107, spacer 501, stressors 301, 303, 401, and 403, and layer 103 of wafer 101. In one embodiment, those structures of wafer 1101 are formed in a similar manner to the corresponding structures of wafer 101 as set forth above with the description of FIGS. 1-5.

FIGS. 10 and 11 set forth an alternative embodiment to that described above with respect to FIGS. 6 and 7 where the deep current electrode regions 1121 an 1123 (See FIG. 11) are formed by ion implantation of current electrode dopant ions 1003 into stressors 1301, 1303, 1401, and 1403 of wafer 1101. In the embodiments of FIGS. 6 and 7, the deep current electrode regions are formed by etching stressors 301, 303, 401, and 403 and epitaxially growing structures 701 and 703 with in-situ current electrode doping.

In one embodiment where boron is implanted, boron ions are implanted at an energy of approximately 5 KeV and at a dose of approximately 5e15 cm$^2$. In one embodiment where phosphorous is implanted, phosphorous ions are implanted at an energy of approximately 10 KeV and at a dose of approximately 6e15 cm$^2$. In one embodiment where arsenic is implanted, arsenic ions are implanted at an energy of approximately 35 KeV and at a dose of approximately 4e15 cm$^2$.

In the embodiment shown, ions 1003 are implanted to a bottom level above the bottom level of stressors 1301 and 1303. However, current electrode ions may be implanted to other levels in other embodiments. For example ions may be implanted at a level lower than the lowest level of stressors 1301 and 1303.

After the stage of FIG. 11, wafer 1101 may be subject to subsequent processes including processes similar to those described with respect to FIGS. 8 and 9. For example, silicide regions may be formed to electrically contact current electrode regions 1121 and 1123. An anneal may be applied prior to silicidation to activate the implanted dopants.

Figure 12:
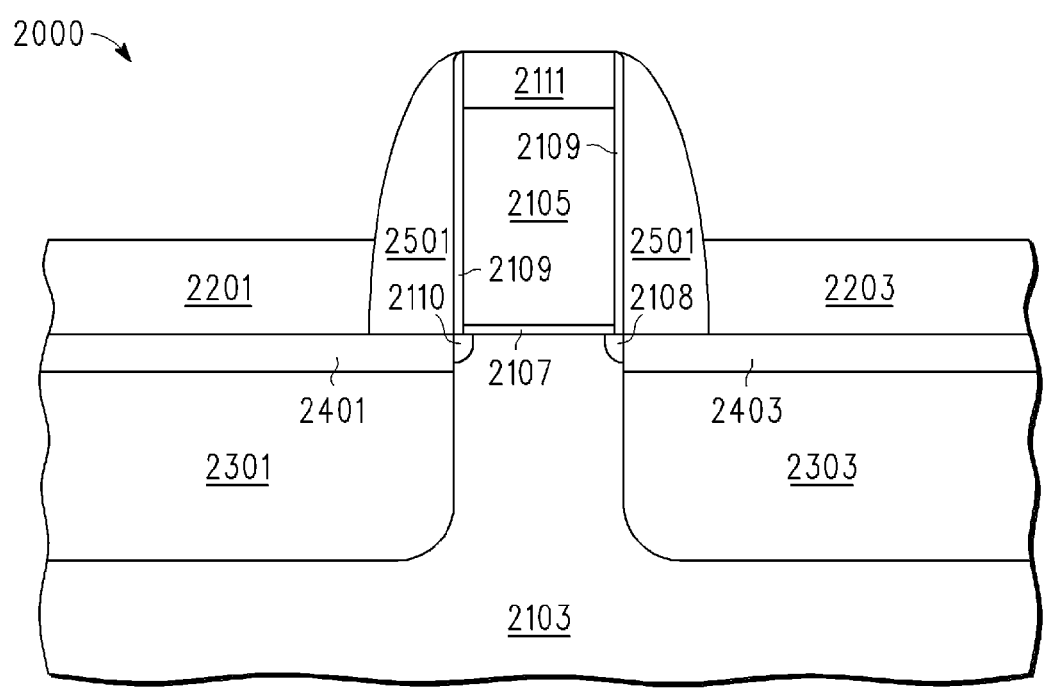
FIG. 12 shows a side cut away view of a stage in the manufacture of a semiconductor device according to another embodiment of the present invention.

FIG. 12 shows a partial cutaway side view of wafer 2101 during a stage in its manufacture according to another embodiment. Wafer 2101 is similar to wafer 101 where cap 2111, gate electrode 2105, spacer 2109, dielectric layer 2107, spacer 2501, regions 2108 and 2110, stressors 2301, 2303, 2401, and 2403, and layer 2103 are similar to cap 111, gate electrode 105, spacer 109, dielectric layer 107, spacer 501, regions 108 and 110, stressors 301, 303, 401, and 403, and layer 103 of wafer 101. In one embodiment, those structures of wafer 1101 are formed in a similar manner to the corresponding structures of wafer 101 as set forth above with the description of FIGS. 1-5.

After the stage in FIG. 5, raised current electrode regions 2201 and 2203 are formed on stressors 2401 and 2403, respectively. In one embodiment, regions 2201 and 2203 are formed by an epitaxial growth process. In other embodiments, regions 2201 and 2203 may be selectively deposited by a non epitaxial process. In one embodiment, regions 2201 and 2203 have a thickness in the range of 100-600 angstroms, but may have other thickness in other embodiments.

In one embodiment, regions 2201 and 2203 are formed under stress (e.g. with an epitaxial process) where the planar lattice constant of the materials of regions 2201 and 2203 does not match their natural lattice constant. In such embodiment, regions 2201 and 2203 would have the same planar lattice constant as stressors 2401 and 2403.

In other embodiments, regions 2201 and 2203 may be formed in a relaxed state.

In one embodiment, regions 2201 and 2203 are formed with current electrode dopants formed in-situ. If the transistor of FIG. 12 is a P-channel transistor, then boron is formed in-situ in regions 2201 and 2203. If the transistor of FIG. 12 is an N-channel transistor, then arsenic or phosphorous is formed in-situ in regions 2201 and 2203. In embodiments where the dopant is boron, the doping concentration of boron is in the range of 1-5e20 atoms/cm$^3$. In embodiments where the dopant is phosphorous, the doping concentration of phosphorous is in the range of 1-5e20 atoms/cm$^3$. In embodiments where the dopant is arsenic, the doping concentration of arsenic is in the range of 1-5e20 atoms/cm$^3$. Regions 2201 and 2203 may have other doping concentration levels in other embodiments.

In other embodiments, regions 2201 and 2203 can be formed with little or no current electrode doping. Subsequently, the current electrode doping would be added by ion implantation.

Wafer 2101 may be subject to subsequent process including those similar to the processes described above with respect to FIGS. 8 and 9. For example, silicide regions may be formed to electrically contact current electrode regions 2201 and 2203.

The processes described above are utilized in forming extensions of source and drain regions that are of a stressor material and are in-situ doped with current electrode dopants. Such processes may be utilized to form other in-situ doped stressor regions of a current electrode.

The term "current electrode" may used to refer to either a source region or a drain region of a field effect transistor. The term "control electrode" may be used to refer to a gate electrode or gate in a field effect transistor. Although the processes set forth above have been described with respect to a field effect transistor, such processes may be utilized for other types of transistors.

In one embodiment, a method includes providing a semiconductor layer, forming a control electrode of a transistor overlying the semiconductor layer, removing a portion of the semiconductor layer lateral to the control electrode to form a first recess and a second recess on opposing sides of the control electrode, and forming a first stressor within the first recess. The first stressor has a first in-situ current electrode doping profile. The method includes forming a second stressor within the second recess. The second stressor has the first in-situ current electrode doping profile. The method also includes forming a third stressor overlying the first stressor. The third stressor has a second in-situ current electrode doping profile that has a higher first conductivity type current electrode doping concentration than the first in-situ current electrode doping profile. The method also includes forming a fourth stressor overlying the second stressor. The fourth stressor has the second in-situ current electrode doping profile. A first current electrode and a second current electrode of the transistor include at least a portion of the third stressor and the fourth stressor, respectively.

In another embodiment, a method includes providing a semiconductor layer, forming a transistor gate of a transistor overlying the semiconductor layer, removing portions of the semiconductor layer lateral to the transistor gate to form a first recess and a second recess, and epitaxially growing a first structure within the first recess on the semiconductor layer. The first structure has a first in-situ current electrode doping profile. The method also includes epitaxially growing a second structure within the second recess on the semiconductor layer. The second structure has the first in-situ current electrode doping profile. The method also includes epitaxially growing a third structure on the first structure. The third structure has a second in-situ current electrode doping profile that has a higher first conductivity type current electrode doping concentration than the first doping profile. The method further includes epitaxially growing a fourth structure on the second structure. The fourth structure having the second in-situ current electrode doping profile. The method further includes forming a sidewall spacer adjacent the transistor gate and completing formation of a source of the transistor and a drain of the transistor using at least a portion of the third structure as a portion of the source of the transistor and using at least a portion of the fourth structure as a portion of the drain of the transistor.

In another embodiment, a transistor includes a semiconductor layer, a control electrode of the transistor overlying the semiconductor layer, and a channel of the transistor underlying the control electrode within the semiconductor layer. The transistor includes a first epitaxial stressor overlying the semiconductor layer and adjacent to a first side of the channel. The first epitaxial stressor has a first in-situ current electrode doping profile. The transistor includes a second epitaxial stressor overlying the semiconductor layer and adjacent to a second side of the channel opposite the first side of the channel. The second epitaxial stressor has the first in-situ current electrode doping profile. The transistor includes a third epitaxial stressor overlying the first epitaxial stressor and adjacent the first side of the channel. The third epitaxial stressor has a second in-situ current electrode doping profile that differs from the first in-situ current electrode doping profile by having a greater first conductivity type in-situ current electrode doping concentration. The transistor includes a fourth epitaxial stressor overlying the second epitaxial stressor adjacent the second side of the channel. The fourth epitaxial stressor having the second in-situ current electrode doping profile. A first current electrode and a second current electrode of the transistor include at least a portion of the third epitaxial stressor and the fourth epitaxial stressor, respectively.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method comprising:
providing a semiconductor layer;
forming a control electrode of a transistor overlying the semiconductor layer;
removing a portion of the semiconductor layer lateral to the control electrode to form a first recess and a second recess on opposing sides of the control electrode;
forming a first stressor within the first recess, the first stressor having a first in-situ current electrode doping profile;
forming a second stressor within the second recess, the second stressor having the first in-situ current electrode doping profile;
forming a third stressor overlying the first stressor, the third stressor having a second in-situ current electrode doping profile that has a higher first conductivity type current electrode doping concentration than the first in-situ current electrode doping profile; and
forming a fourth stressor overlying the second stressor, the fourth stressor having the second in-situ current electrode doping profile;
wherein a first current electrode and a second current electrode of the transistor include at least a portion of the third stressor and the fourth stressor, respectively;
forming a sidewall spacer adjacent the control electrode, wherein the sidewall spacer overlies a portion of the first stressor, a portion of the second stressor, a portion of the third stressor, and a portion of the fourth stressor;
wherein the first current electrode includes an extension region;
wherein the second current electrode includes an extension region;
wherein the extension region of the first current electrode includes a portion of the third stressor;
wherein the extension region of the second current electrode includes a portion of the fourth stressor.

2. The method of claim 1 wherein:
the forming the first stressor and the forming the second stressor comprises forming the first stressor and the second stressor by epitaxially growing semiconductor material on the semiconductor layer;
the forming the third stressor and the forming the fourth stressor comprises forming the third stressor and the fourth stressor by epitaxially growing an in-situ current electrode doped semiconductor material on the first stressor and the second stressor, respectively.

3. The method of claim 2 wherein:
the transistor is one of a P-channel transistor or an N-channel transistor;
the in-situ current electrode doped semiconductor material is in-situ doped with boron if the transistor is a P-channel transistor and is in-situ doped with at least one of a group consisting of phosphorus, arsenic or antimony if the transistor is an N-channel transistor.

4. A method comprising:
providing a semiconductor layer;
forming a control electrode of a transistor overlying the semiconductor layer;
removing a portion of the semiconductor layer lateral to the control electrode to form a first recess and a second recess on opposing sides of the control electrode;
forming a first stressor within the first recess, the first stressor having a first in-situ current electrode doping profile;
forming a second stressor within the second recess, the second stressor having the first in-situ current electrode doping profile;
forming a third stressor overlying the first stressor, the third stressor having a second in-situ current electrode doping profile that has a higher first conductivity type current electrode doping concentration than the first in-situ current electrode doping profile; and
forming a fourth stressor overlying the second stressor, the fourth stressor having the second in-situ current electrode doping profile;
wherein a first current electrode and a second current electrode of the transistor include at least a portion of the third stressor and the fourth stressor, respectively;
wherein:
the semiconductor layer is characterized as a silicon layer;
the transistor is characterized as a P-channel transistor or an N-channel transistor;
the first stressor, the second stressor, the third stressor, and the fourth stressor include silicon germanium where the transistor is characterized as a P-channel transistor;
the first stressor, the second stressor, the third stressor, and the fourth stressor include silicon carbon where the transistor is characterized as an N-channel transistor.

5. The method of claim 1 further comprising:
forming a third recess and a fourth recess, wherein the forming the third recess and the fourth recess includes:
removing portions of the third stressor and the fourth stressor to expose a portion of the first stressor and the second stressor, wherein the portions removed include portions not underlying the sidewall spacer to expose a portion of the first stressor and the second stressor, wherein the removing portions leave at least some portions of the third stressor and the fourth stressor under the sidewall spacer;
removing portions of the first stressor and the second stressor; and
forming a portion of the first current electrode and a portion of the second current electrode for the transistor, wherein the forming a portion of the first current electrode and a portion of the second current electrode further includes epitaxially growing an in-situ current electrode doped stressor material within the third recess and epitaxially growing an in-situ current electrode doped stressor material within the fourth recess.

6. The method of claim 1 further comprising:
forming a portion of the first current electrode and a portion of the second current electrode for the transistor, wherein the forming a portion of the first current electrode and a portion of the second current electrode further includes ion implanting a second portion of each of the third stressor and the fourth stressor located lateral to the sidewall spacer.

7. The method of claim 1 further comprising:
forming a portion of the first current electrode and a portion of the second current electrode for the transistor, wherein the forming a portion of the first current electrode and a portion of the second current electrode further includes forming elevated in-situ current electrode doped current electrode regions above exposed portions of the third stressor and the fourth stressor adjacent to the sidewall spacer.

8. The method of claim 7 wherein the forming the elevated in-situ current electrode doped current electrode regions further includes forming the elevated current electrode regions above exposed portions of the third stressor and the fourth stressor by epitaxial growth.

9. The method of claim 1 wherein the first current electrode doping profile has a concentration of approximately $1\times10^{16}$ atoms/cm$^3$ or lower of an in-situ current electrode dopant of the first conductivity type.

10. The method of claim 4 wherein:
the first current electrode includes an extension region;
the second current electrode includes an extension region;
the extension region of the first current electrode includes a portion of the third stressor;
the extension region of the second current electrode includes a portion of the fourth stressor.

11. A method comprising:
providing a semiconductor layer;
forming a transistor gate of a transistor overlying the semiconductor layer;
removing portions of the semiconductor layer lateral to the transistor gate to form a first recess and a second recess;
epitaxially growing a first structure within the first recess on the semiconductor layer, the first structure having a first in-situ current electrode doping profile;
epitaxially growing a second structure within the second recess on the semiconductor layer, the second structure having the first in-situ current electrode doping profile;
epitaxially growing a third structure on the first structure, the third structure having a second in-situ current electrode doping profile that has a higher first conductivity type current electrode doping concentration than the first in-situ current electrode doping profile;
epitaxially growing a fourth structure on the second structure, the fourth structure having the second in-situ current electrode doping profile;
forming a sidewall spacer adjacent the transistor gate, wherein the sidewall spacer overlies a portion of the first structure, a portion of the second structure, a portion of the third structure, and a portion of the fourth structure; and
completing formation of a source of the transistor and a drain of the transistor using at least a portion of the third structure as a portion of the source of the transistor and using at least a portion of the fourth structure as a portion of the drain of the transistor
wherein the source of the transistor includes an extension region, the extension region including a portion of the third structure located under the sidewall spacer;
wherein the drain of the transistor includes an extension region, the extension region including a portion of the fourth structure located under the sidewall spacer.

12. The method of claim 11 wherein the first in-situ current electrode doping profile has a concentration of approximately $1\times10^{16}$ atoms/cm$^3$ or lower of an in-situ current electrode dopant of the first conductivity type.

13. The method of claim 11 wherein the first in-situ current electrode doping profile has a higher second conductivity type current electrode doping concentration than the second in-situ current electrode doping profile, the second conductivity type being opposite the first conductivity type.

14. The method of claim 11 wherein the completing formation of the source of the transistor and the drain of the transistor further comprises:
removing portions of the first structure, portions of the second structure, portions the third structure, and portions the fourth structure to form a third recess and a fourth recess lateral to the transistor gate and the sidewall spacer, wherein the portions of the first structure, the portions of the second structure, the portions the third structure, and the portions the fourth structure each include portions not located under the transistor gate;
epitaxially growing a first in-situ current electrode doped semiconductor structure in the third recess, wherein the source includes at least a portion of the first in-situ current electrode doped semiconductor structure; and
epitaxially growing a second in-situ current electrode doped semiconductor structure in the fourth recess, the drain includes at least a portion of the second in-situ current electrode doped semiconductor structure.

15. The method of claim 11 wherein:
the forming a sidewall spacer adjacent the transistor gate includes forming the sidewall spacer overlying a portion of the third structure and a portion of the fourth structure;
the completing formation of the source of the transistor and the drain of the transistor further comprises:
ion implanting portions of the first structure, the second structure, the third structure, and the fourth structure located outside of the sidewall spacer and transistor gate to form a deep source region and a deep drain region.

16. The method of claim 11 wherein the completing formation of the source of the transistor and the drain of the transistor further comprises:
forming an elevated doped source region on the third structure and forming an elevated drain region on the fourth structure.

17. The method of claim 11 wherein:
the first semiconductor layer has a first lattice constant in a planar direction;
wherein a natural lattice constant of the first structure, a natural lattice constant of the second structure, a natural lattice constant of the third structure, and a natural lattice constant of the fourth structure is each different than the first lattice constant.

18. The method of claim 11 wherein:
the semiconductor layer is characterized as a silicon layer;
the transistor is characterized as a P-channel transistor or an N-channel transistor;
the first structure, the second structure, the third structure, and the fourth structure include silicon germanium where the transistor is characterized as a P-channel transistor;
the first structure, the second structure, the third structure, and the fourth structure include silicon carbon where the transistor is characterized as an N-channel transistor.

19. The method of claim 1 wherein:
the semiconductor layer is characterized as a silicon layer;
the transistor is characterized as a P-channel transistor or an N-channel transistor;

the first stressor, the second stressor, the third stressor, and the fourth stressor include silicon germanium where the transistor is characterized as a P-channel transistor;

the first stressor, the second stressor, the third stressor, and the fourth stressor include silicon carbon where the transistor is characterized as an N-channel transistor.

20. The method of claim 4 wherein:

the forming the first stressor and the forming the second stressor comprises forming the first stressor and the second stressor by epitaxially growing semiconductor material on the semiconductor layer;

the forming the third stressor and the forming the fourth stressor comprises forming the third stressor and the fourth stressor by epitaxially growing an in-situ current electrode doped semiconductor material on the first stressor and the second stressor, respectively.

21. The method of claim 4 further comprising:

forming a sidewall spacer adjacent the control electrode and overlying a portion of the third stressor and a portion of the fourth stressor;

forming a third recess and a fourth recess, wherein the forming the third recess and the fourth recess includes:

removing portions of the third stressor and the fourth stressor to expose a portion of the first stressor and the second stressor, wherein the portions removed include portions not underlying the sidewall spacer to expose a portion of the first stressor and the second stressor, wherein the removing portions leave at least some portions of the third stressor and the fourth stressor under the sidewall spacer;

removing portions of the first stressor and the second stressor; and forming a portion of the first current electrode and a portion of the second current electrode for the transistor, wherein the forming a portion of the first current electrode and a portion of the second current electrode further includes epitaxially growing an in-situ current electrode doped stressor material within the third recess and epitaxially growing an in-situ current electrode doped stressor material within the fourth recess.

22. The method of claim 4 further comprising:

forming a sidewall spacer adjacent the control electrode of the transistor and overlying a first portion of each of the third stressor and the fourth stressor;

forming a portion of the first current electrode and a portion of the second current electrode for the transistor, wherein the forming a portion of the first current electrode and a portion of the second current electrode further includes ion implanting a second portion of each of the third stressor and the fourth stressor located lateral to the sidewall spacer.

23. The method of claim 4 further comprising:

forming a sidewall spacer adjacent the control electrode of the transistor and overlying a first portion of each of the third stressor and the fourth stressor; and forming a portion of the first current electrode and a portion of the second current electrode for the transistor, wherein the forming a portion of the first current electrode and a portion of the second current electrode further includes forming elevated in-situ current electrode doped current electrode regions above exposed portions of the third stressor and the fourth stressor adjacent to the sidewall spacer.

\* \* \* \* \*